United States Patent
Roxlo et al.

(10) Patent No.: US 6,947,199 B2
(45) Date of Patent: Sep. 20, 2005

(54) LOOSELY-PACKED TWO-DIMENSIONAL MODULATOR ARRANGEMENT

(75) Inventors: Charles B. Roxlo, Saratoga, CA (US); David T. Amm, Sunnyvale, CA (US)

(73) Assignee: Silicon Light Machines Corporation, Sunnyvale, CA (US)

(*) Notice: Subject to any disclaimer, the term of this patent is extended or adjusted under 35 U.S.C. 154(b) by 0 days.

(21) Appl. No.: 10/808,152

(22) Filed: Mar. 24, 2004

(65) Prior Publication Data

US 2004/0196526 A1 Oct. 7, 2004

Related U.S. Application Data

(60) Provisional application No. 60/458,920, filed on Mar. 28, 2003.

(51) Int. Cl.[7] ............................ G02B 26/00; G02B 27/10
(52) U.S. Cl. ........................ 359/291; 359/290; 359/292; 359/619
(58) Field of Search ................................ 359/290, 291, 359/298, 254, 292, 619, 559, 224, 855, 572; 345/6; 355/53, 67, 71; 430/5, 22, 30, 296, 322, 396; 250/292.22, 492.1

(56) References Cited

U.S. PATENT DOCUMENTS

| | | | |
|---|---|---|---|
| 5,459,610 A | * | 10/1995 | Bloom et al. ............... 359/572 |
| 5,661,592 A | | 8/1997 | Bornstein et al. |
| 5,841,579 A | | 11/1998 | Bloom et al. |
| 5,900,637 A | | 5/1999 | Smith |
| 5,949,570 A | * | 9/1999 | Shiono et al. ............... 359/291 |
| 6,133,986 A | | 10/2000 | Johnson |
| 6,312,134 B1 | | 11/2001 | Jain et al. |
| 6,379,867 B1 | | 4/2002 | Mei et al. |
| 6,473,237 B2 | | 10/2002 | Mei |
| 6,646,623 B1 | * | 11/2003 | Chakrabarti ................ 345/6 |
| 2002/0092993 A1 | | 7/2002 | Kanatake et al. |
| 2003/0058520 A1 | | 3/2003 | Yu et al. |

OTHER PUBLICATIONS

PCT International Search Report for International Application No. PCT/US2004/09292 (2 sheets).

* cited by examiner

*Primary Examiner*—Georgia Epps
*Assistant Examiner*—Jack Dinh
(74) *Attorney, Agent, or Firm*—Okamoto & Benedicto LLP

(57) ABSTRACT

In one embodiment, an imaging apparatus includes a light modulator array having modulators arranged in a loosely-packed configuration. For example, the modulators may be arranged in columns at a first pitch, and the columns may be spaced at a second pitch. The optically active areas of the modulators may form a repeating pattern including a hexagonal pattern, a rectangular pattern, or a diamond pattern. In one embodiment, the modulators are diffractive light modulators.

13 Claims, 13 Drawing Sheets

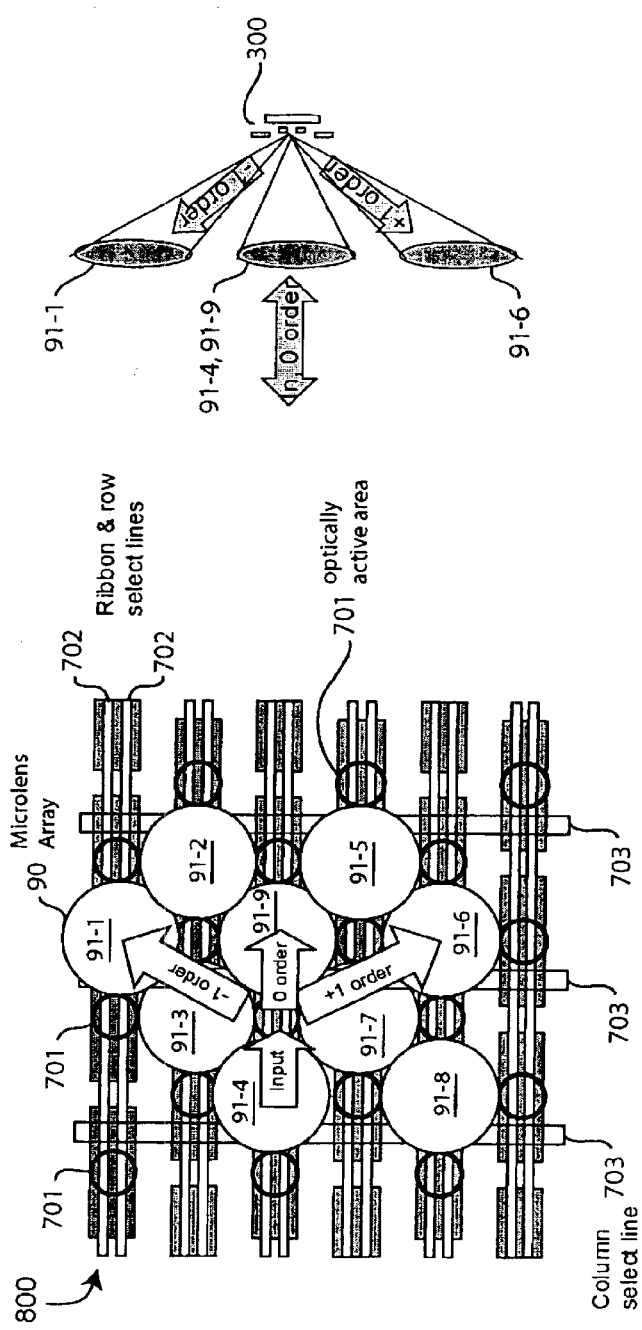
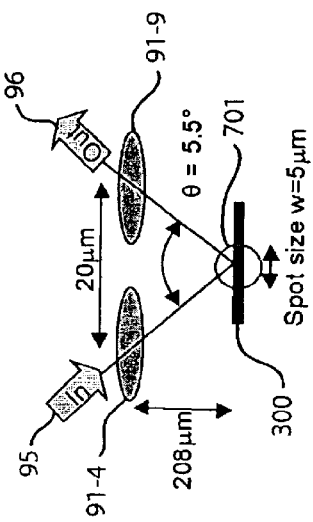
FIG. 10A
FIG. 10B
FIG. 10C

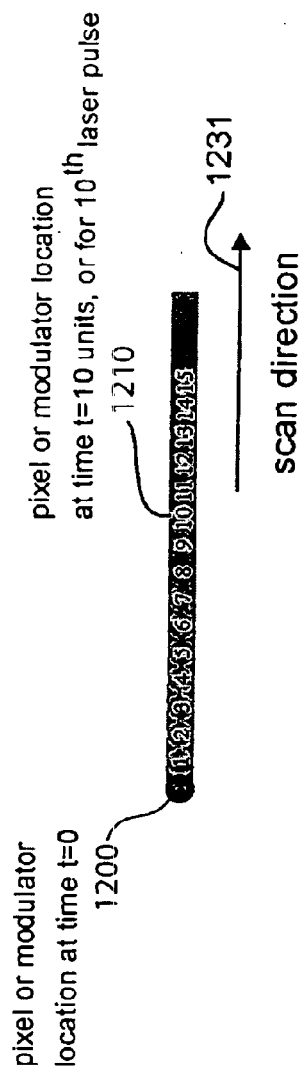
FIG. 12A
FIG. 12B
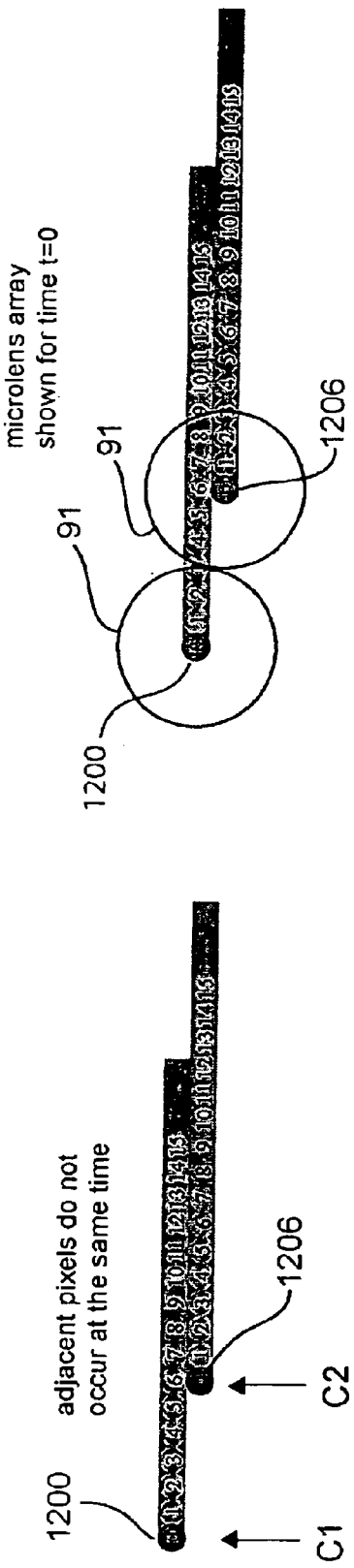
FIG. 12C

LOOSELY-PACKED TWO-DIMENSIONAL MODULATOR ARRANGEMENT

CROSS-REFERENCE TO RELATED APPLICATION

This application claims the benefit of U.S. Provisional Application No. 60/458,920, entitled, "Loosely-Packed Two-Dimensional Modulator Arrangement," filed on Mar. 28, 2003 by Charles B. Roxlo and David T. Amm, incorporated herein by reference in its entirety.

BACKGROUND OF THE INVENTION

1. Field of the Invention

The present invention relates generally to imaging systems, and more particularly but not exclusively to light modulator arrays.

2. Description of the Background Art

A micro electromechanical system (MEMS), such as light modulators, typically includes micromechanical structures that may be actuated using electrical signals. Examples of MEMS light modulators include the Grating Light Valve™ (GLV™) light modulators available from Silicon Light Machines, Inc. of Sunnyvale, Calif. GLV-type light modulators typically include an array of moveable structures referred to as "ribbons." GLV-type light modulators are also referred to herein as "ribbon light modulators."

Light modulators, in general, may be employed in various applications including video, printing, and optical switching, for example. Light modulators may also be employed in so-called "maskless lithography" where a mask and/or reticle can be replaced by a dynamic direct writing process using light modulators. Such a system could speed up chip design cycle times and reduce cost, particularly with respect to design changes, which would previously require one or more new masks to be made for each design revision. Similar systems can also be used in patterning masks.

FIGS. 1–4 show schematic diagrams of example maskless lithography systems. In the maskless lithography system of FIG. 1, a deep ultraviolet (DUV) laser 150 provides an optical source through conditioning and illumination optics 151 and onto a light modulator device 152 that is controlled by data input and drivers 153 according to an associated image database 160. Image database 160 comprises a plurality of pixels of a two-dimensional pattern or image. Light modulated by the modulator device 152 goes through relay optics and Fourier filter 154, an intermediate image plane 155, projection optics 156, and on to the wafer 157. The wafer 157 is scanned relative to the light beam by a movable wafer stage 158. With this system, "swaths" or lines can be imaged on the wafer surface and, using photosensitive layers, as in conventional lithography, patterns can be exposed on the wafer surface.

The maskless lithography system of FIG. 2 employs a scanned linear (i.e., one-dimensional) light modulator array 172. Illumination from a light source 131 is modulated by modulator array 172 onto an Offner relay 173. From Offner relay 173, the modulated light is projected on the wafer 176 by way of an intermediate image plane 174 and projection lens 175.

FIG. 3 schematically illustrates how an image modulated by a linear light modulator array may be scanned onto a wafer. In the maskless lithography system of FIG. 3, a laser 181 serves as a light source. Light from laser 181 is modulated by a linear light modulator device 183 by way of beam shaping optics 182. Light modulator device 183 modulates incident light in accordance with an image stored in an image computer 184. The modulated light passes through reduction lens 136 and onto a wafer 185. Because it comprises a one-dimensional array of light modulators, light modulator device 183 projects the image onto wafer 185 one column of pixels at a time. Wafer 185 is scanned (e.g., using a wafer stage) relative to linear light modulator device 183 to project the entire image onto the wafer.

A one-dimensional maskless lithography system, such as that employed in the systems of FIGS. 2 and 3, is limited in the number of pixels that can be written at a single time. This problem can be overcome by using a two-dimensional light modulator array. A two-dimensional light modulator array allows for the writing of more than one column of pixels at a time. For example, as shown in the maskless lithography system of FIG. 4, illumination from a light source 191 may be projected on a two-dimensional light modulator array 193 by way of collimating lens 198 and microlens array 90. Microlens array 90 focuses the light beam on the modulating elements of modulator array 193. Light modulator array 193 modulates incident light onto a wafer 197 by way of an Offner relay 194, a prism 189, microlens array 171, an intermediate plane 195, and projection lens 196. The Offner relay 194 is a reflective optical device that is composed of two reflecting mirror elements 187 and 186. The Offner relay 194 effectively performs Fourier transform and inverse Fourier transform functions to accomplish a one-to-one imaging relationship with an intermediate Fourier plane located at the surface of element 186. A filter can be added at the element 186 location to perform Fourier filtering. Thus, element 186 serves as both a mirror and a Fourier plane filter. The Offner relay 194 is used here as a generic example of a Fourier optics filtering system. Equivalently, other types of reflective or refractive optical components may also be used to perform this function. The component (i.e., order) of the modulated light not filtered out by the Fourier plane filter function of element 186 reaches a prism 189 by way of mirror element 187. Prism 189 directs the modulated light onto microlens array 171, which focuses the light onto an intermediate image plane 195 and projection lens 196. The modulated light reaches wafer 197 underneath projection lens 196 to print a pattern thereon.

Other lithography systems are also disclosed in U.S. Pat. No. 6,379,867 to Mei et al., U.S. Pat. No. 6,473,237 to Mei, U.S. Pat. No. 6,312,134 to Jain et al., U.S. Pat. No. 5,900,637 to Smith, U.S. Pat. No. 6,133,986 to Johnson, and U.S. Publication No. 2002/0092993 by Kanatake et al., all of which are incorporated herein by reference in their entirety.

The modulator arrangements of the aforementioned maskless lithography systems may include one-dimensional and/or two-dimensional configurations of tightly-packed modulators. That is, the modulators substantially have the same spacing or pitch in both dimensions. A characteristic of tightly-packed modulators is that the modulators may interact optically and often coherently. While this may not be a problem in systems where such interacting modulators map to ultimate pixels that will be adjacent to each other, such as in display systems, it is not advantageous for systems without such mapping. For example, in systems where adjacent modulators on the light modulator array form and/or map to non-adjacent pixels on the ultimate image or lithographic target, such a tightly-packed modulator arrangement is not optimal. Thus, a two-dimensional light modulator array arrangement capable of supporting an adjacent to non-adjacent modulator mapping for optimal optical resolution is generally desirable.

SUMMARY

In one embodiment, an imaging apparatus includes a light modulator array having modulators arranged in a loosely-packed configuration. For example, the modulators may be arranged in columns at a first pitch, and the columns may be spaced at a second pitch. The optically active areas of the modulators may form a repeating pattern including a hexagonal pattern, a rectangular pattern, or a diamond pattern. In one embodiment, the modulators are diffractive light modulators.

These and other features of the present invention will be readily apparent to persons of ordinary skill in the art upon reading the entirety of this disclosure, which includes the accompanying drawings and claims.

DESCRIPTION OF THE DRAWINGS

FIG. 10, which consists of FIGS. 10A, 10B, and 10C, pictorially illustrates the optical relationship between a microlens array and a two-dimensional light modulator array in the system of FIG. 4, in accordance with an embodiment of the present invention.

FIG. 12, which consists of FIGS. 12A, 12B, and 12C, pictorially illustrates the scanning relationships between loosely-packed modulators in a two-dimensional modulator array in accordance with an embodiment of the present invention.

Figure 1:
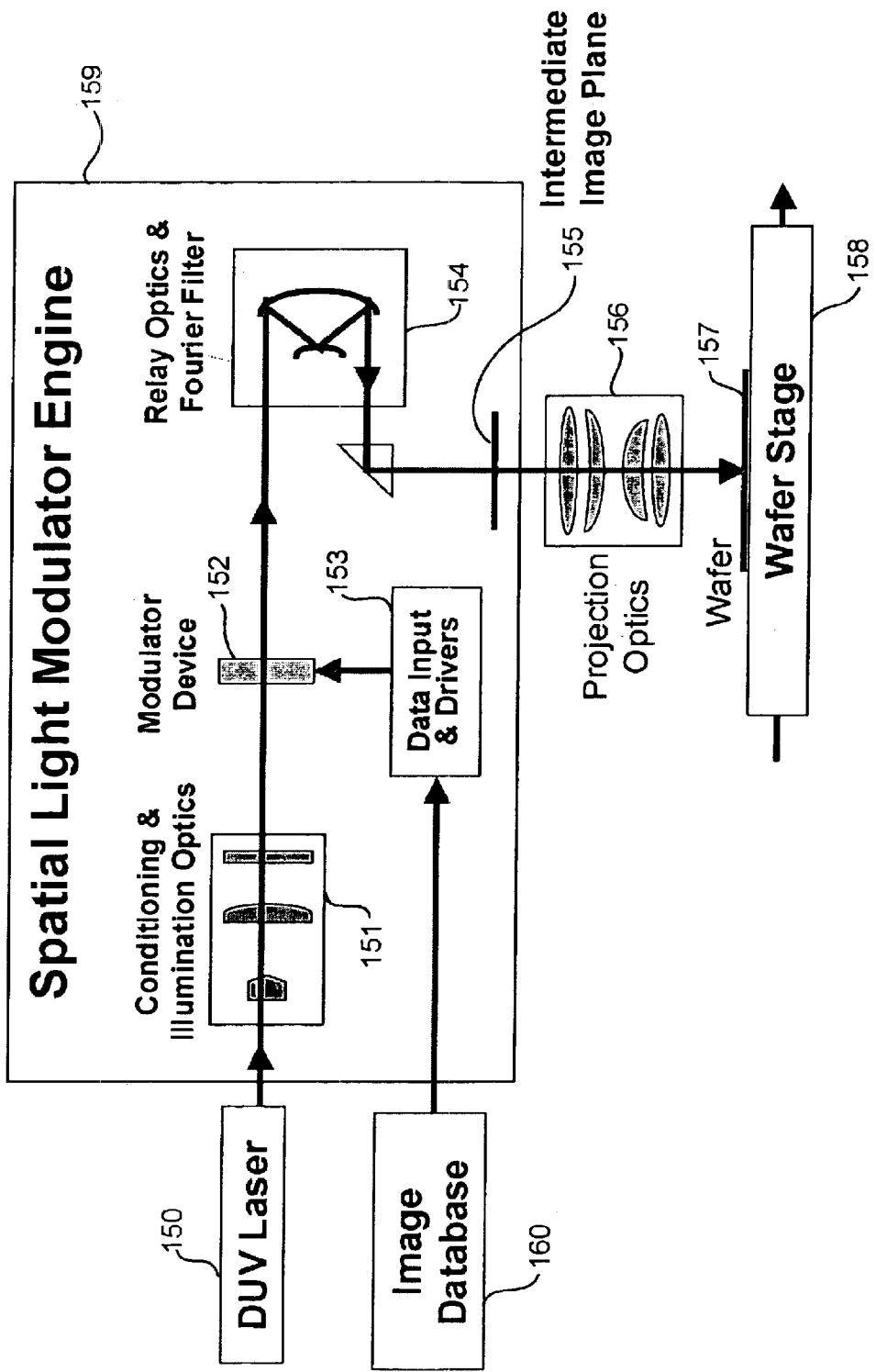
FIGS. 1–4 show schematic diagrams of example maskless lithography systems.
Figure 2:
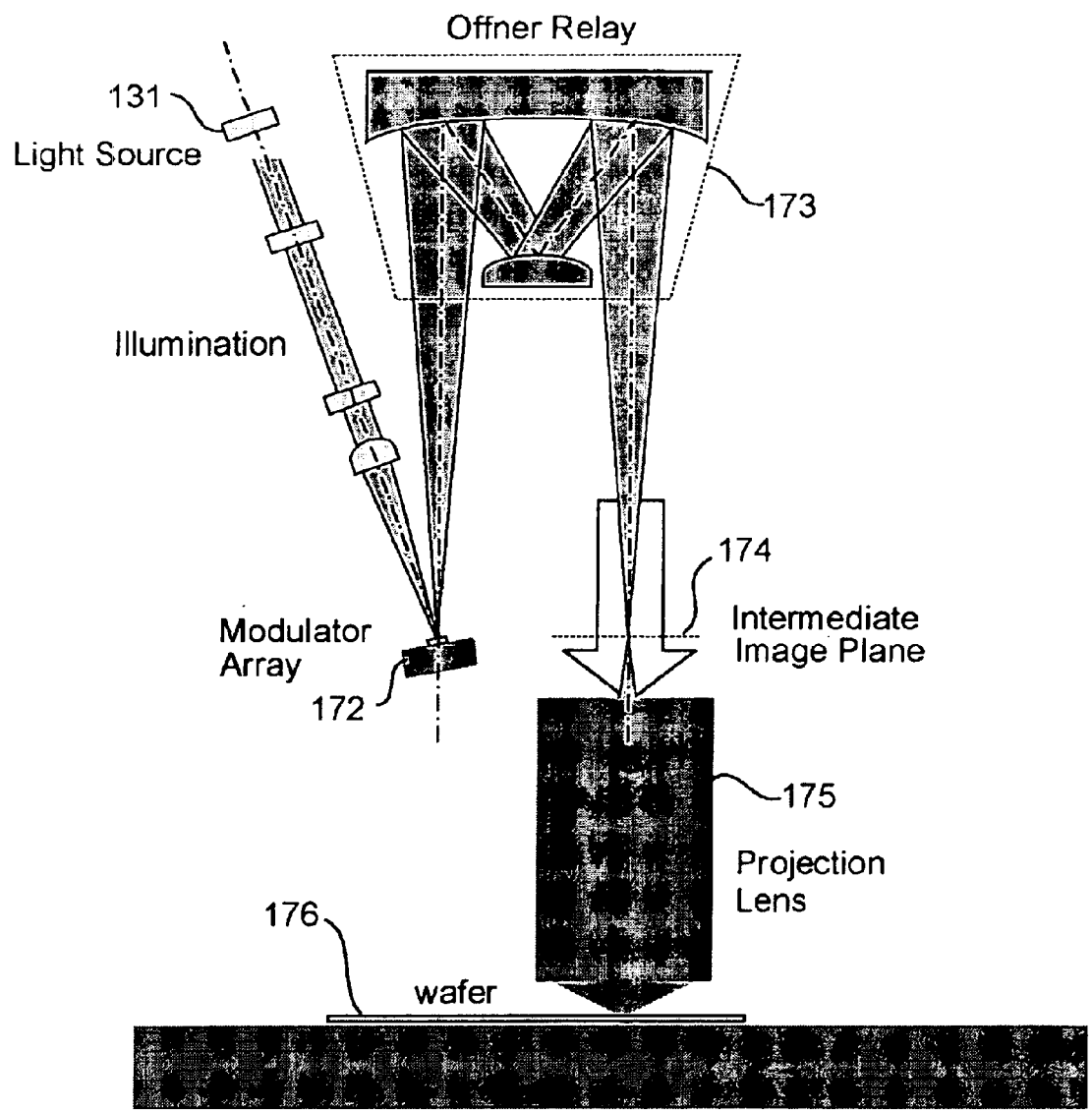
Figure 3:
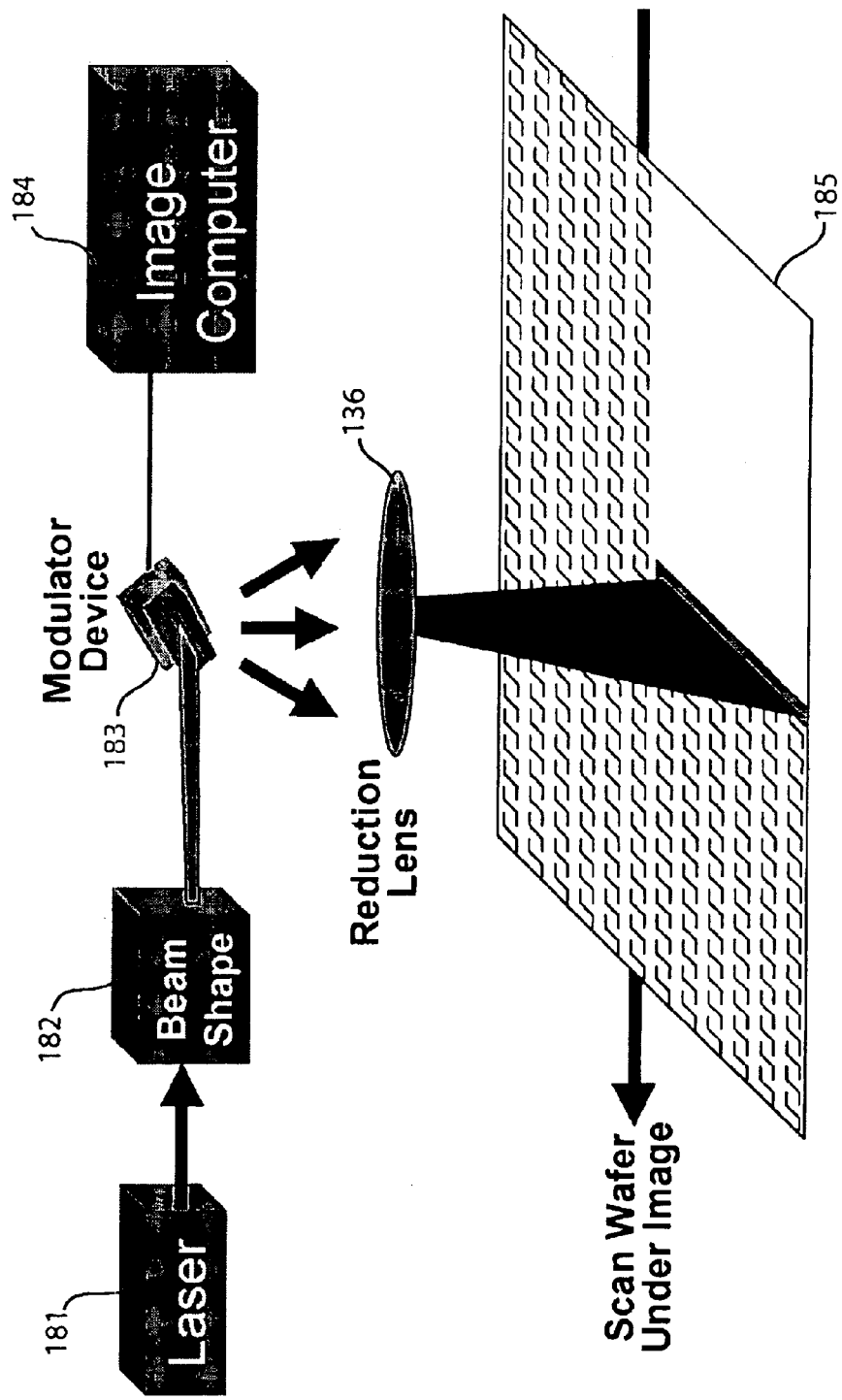

The use of the same reference label in different drawings indicates the same or like components. Drawings are not necessarily to scale unless otherwise noted.

DETAILED DESCRIPTION

In the present disclosure, numerous specific details are provided, such as examples of apparatus, components, dimensions, angles, lens arrangements, optical configurations, and methods, to provide a thorough understanding of embodiments of the invention. Persons of ordinary skill in the art will recognize, however, that the invention can be practiced without one or more of the specific details. In other instances, well-known details are not shown or described to avoid-obscuring aspects of the invention.

It is to be noted that embodiments of the present invention are described herein using ribbon light modulators as examples, not limitations. Embodiments of the present invention may be employed generally in light modulator applications, especially in MEMS based diffractive light modulators. Furthermore, embodiments of the present invention may be employed in the processing of substrates other than wafers. Imprinting a pattern on a substrate should be understood as patterning the substrate itself or a film/material on the substrate.

Ribbon light modulators, such as the GLV™ light modulators from Silicon Light Machines Inc., have been employed in a variety of applications that require high speed, multi-pixel optical modulation. Ribbon light modulators are also disclosed in U.S. Pat. No. 5,841,579 and U.S. Pat. No. 5,661,592, which are both incorporated herein by reference in their entirety. A ribbon light modulator is characterized by a resilient, movable micro structure that is controllably flexed by electrostatic force to diffract or reflect incident light. Ribbon light modulators, unlike tilt mirrors, are diffractive light modulators.

Although one-dimensional ribbon light modulator arrays have many advantages, they also have a number of limitations. Firstly, the number of pixels in a one-dimensional ribbon light modulator array is limited to several thousands because of practical limitations on the size of the die. Secondly, highly anamorphic optics may be needed to illuminate the ribbons in a line that is very asymmetric (e.g. a few microns by several millimeters). While this is an advantage for scanning applications, such as a video display, it may pose limitations for some lithography applications. Thirdly, the close packing of pixels in one dimension means that these pixels may interact optically, often coherently. While this poses little problem in systems where those pixels will be adjacent on the ultimate image (again, in video display applications), it is a disadvantage in optical systems where adjacent pixels on the ribbon light modulator array will form non-adjacent pixels on the ultimate image or lithographic target.

A number of lithography applications, such as maskless lithography on silicon wafers, require very high pixel rate combined with state-of-the-art optical resolution on the target. For example, a maskless lithography application may require a throughput of 100 Gigapixels per second and a 100 nm spot size on the wafer. The high throughput calls for a very large number of modulating elements of the pattern generator, which may be up to several million pixels. This is relatively difficult to accomplish using a one-dimensional pattern generator, such as a conventional linear ribbon light modulator.

Mei, in U.S. Pat. No. 6,473,237, has suggested combining a two-dimensional modulator array with a two-dimensional array of micro lenses to achieve a high density of very small spots. These microlens arrays, which may be zone plate arrays, are also suggested in U.S. Pat. No. 5,900,637 to Smith and U.S. Pat. No. 6,133,986 to Johnson. These microlens arrays can be coupled naturally to a two-dimensional tilt mirror array, such as that commercially available from Texas Instruments, Inc. One-dimensional ribbon light modulators have a number of advantageous over tilt mirrors, including speed, gray scaling capability, and manufacturability, but are relatively difficult to couple to a two-dimensional array of spots to be modulated or to a microlens array.

Figure 5A:
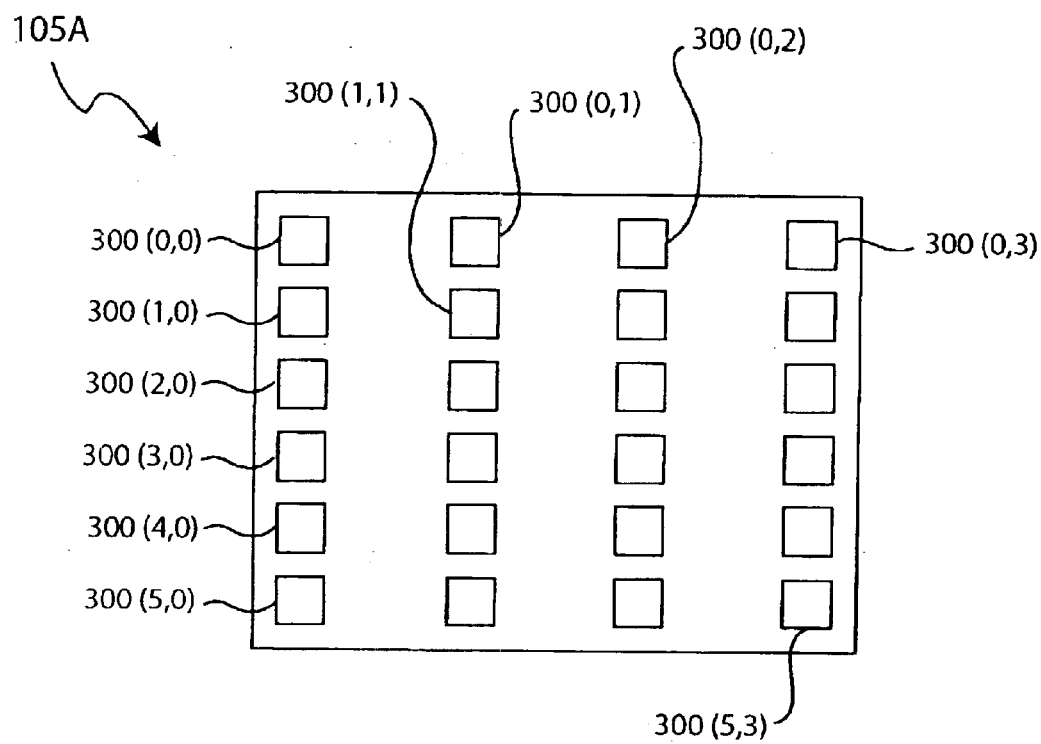
FIGS. 5A and 5B show schematic diagrams of light modulator arrays in accordance with embodiments of the present invention.

Referring now to FIG. 5A, there is shown a schematic diagram of a two-dimensional light modulator array 105A in accordance with an embodiment of the present invention. Light modulator array 105A includes a plurality of diffractive light modulating elements 300, which are ribbon light modulators in one embodiment. Each modulating element 300 corresponds to a pixel of an image, which may be a pattern to be transferred to a substrate, such as a wafer in a maskless lithography application, for example. Light modulator array 105A is shown as having 6×4 (i.e., 6 rows by 4 columns) modulating elements 300 for illustration purposes only. Less or more modulating elements may be used depending on the application. In the example of FIG. 5A, each modulating element 300 is labeled as 300 (x, y) according to its row "x" and column "y" position. For example, modulating element 300 (0,0) indicates a modulating element in row 0, column 0; modulating element 300 (1,0) indicates a modulating element in row 1, column 0; modulating element 300 (2,0) indicates a modulating element in row 2, column 0, and so on.

In the example of FIG. 5A, the modulating elements 300 have a loosely-packed configuration between columns. For purposes of the present disclosure, "loosely-packed" refers to a modulator arrangement wherein the spacing (i.e., pitch) between modulating elements in at least one dimension is at least twice the size of the optically active area of a modulating element. The optically active area is the portion of the modulating element employed to modulate incident light. In the case of a ribbon light modulator, the optically active area is the portion of the reflective surface that diffracts or reflects incident light. For comparison purposes, a tightly-packed configuration would have the optically active area making up the majority of the area in the vicinity of the modulating element.

In the example of FIG. 5A, modulating elements 300 along a row are loosely packed, while modulating elements 300 along a column are tightly packed. Note that light modulators may be physically next to each other but remain loosely-packed, so long as the optically active areas of the light modulators have a substantial space between them. The loosely-packed configuration advantageously allows for a light modulator array that minimizes the aforementioned problems associated with conventional light modulators. Furthermore, the loosely-packed configuration allows for placement of associated electronics in the die without interfering with optically active areas.

Figure 5B:
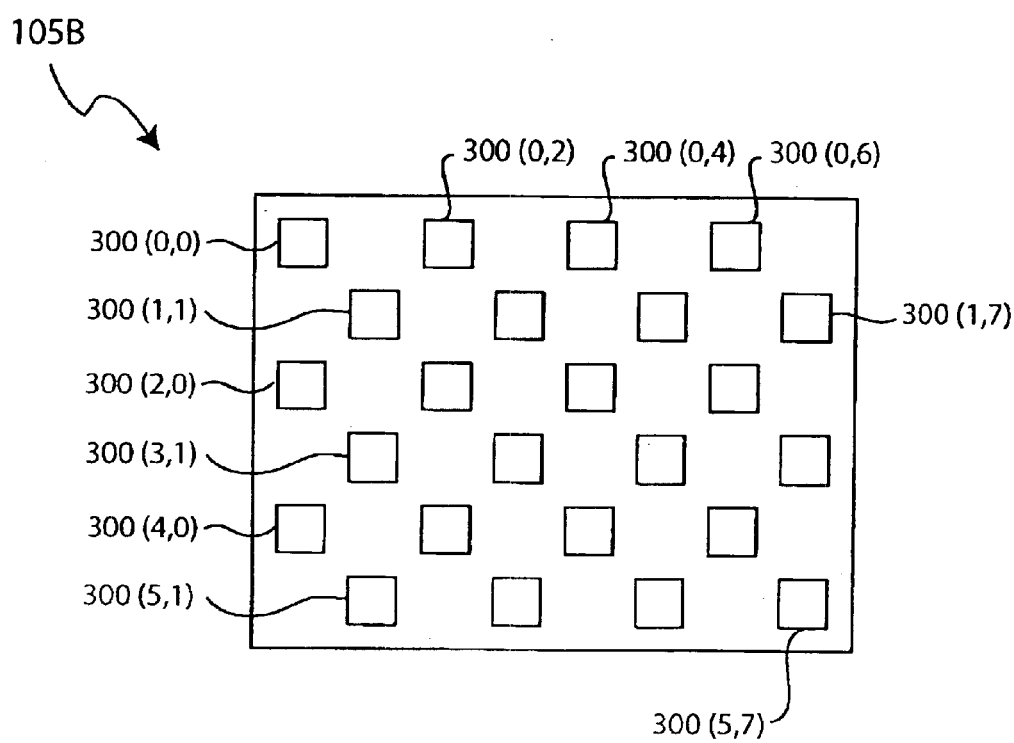

In light of the present disclosure, it can be appreciated that a loosely-packed configuration of two-dimensional diffractive light modulators may be achieved using other arrangements. For example, FIG. 5B shows a light modulator array 105B with another loosely-packed configuration of modulating elements 300 in accordance with an embodiment of the present invention. In the example of FIG. 5B, modulating elements 300 are diffractive light modulators laid out as a tilted square array, where there is substantial pitch between elements 300 in either dimension. As in FIG. 5A, each modulating element 300 in FIG. 5B is labeled as 300 (x, y) according to its row "x" and column "y" position.

Figure 6A:
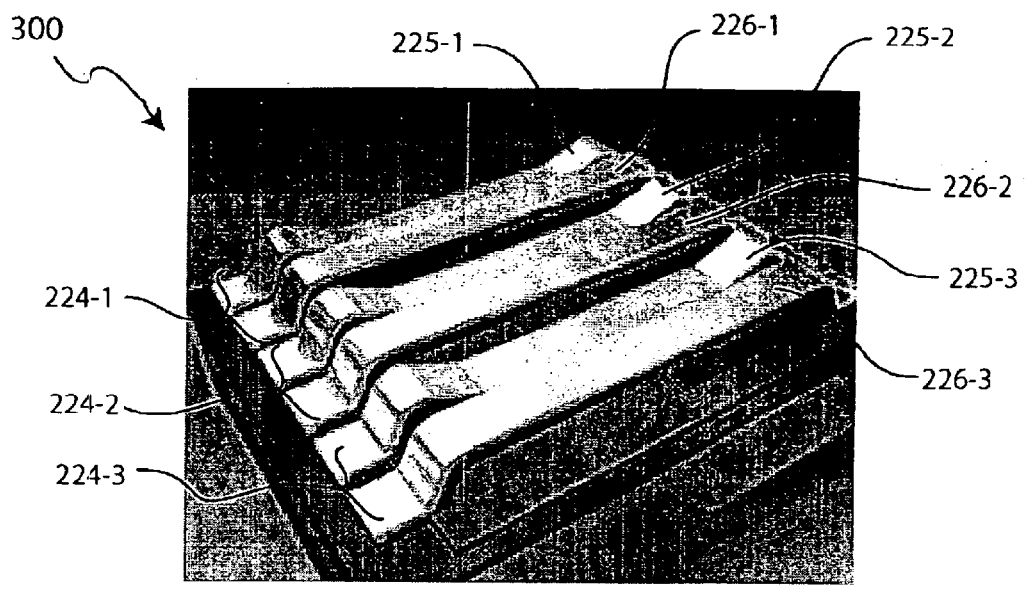
FIG. 6A shows a prospective view of a ribbon light modulator.

FIG. 6A shows a perspective view of a ribbon light modulator 300, which may be of the same type as the GLV™ light modulator from Silicon Light Machines, Inc. A light modulator 300 may serve as a modulating element for a pixel of an image or pattern to be transferred onto a target, such as a substrate. Each modulator 300 comprises an array of ribbon pairs 224 (224-1, 224-2, 224-3). In the example of FIG. 6A, a modulator 300 has three ribbon pairs to modulate a pixel of a pattern. Note that depending on the application, a modulator 300 may also have two or some other number of ribbon pairs per pixel. Each ribbon pair 224 comprises a fixed ribbon 226 (226-1, 226-2, 226-3) and a deflectable ribbon 225 (225-1, 225-2, 225-3). In the example of FIG. 6A, ribbon pair 224-1 comprises fixed ribbon 226-1 and deflectable ribbon 225-1, ribbon pair 224-2 comprises fixed ribbon 226-2 and deflectable ribbon 225-2, and so on. In one embodiment, a ribbon may be a silicon nitride microstructure coated with a reflective surface of aluminum alloy. The portion of the reflective surface employed to diffract or reflect incident light is the optically active area of the light modulator. Ribbon pairs 224 may be fabricated using MEMS technology.

Ribbon pairs 224 are suspended above an air gap. Underneath ribbon pairs 224 is a common bottom electrode, which may be set at ground potential. Applying a bias voltage on ribbons 225 results in an electrostatic force that attracts deflectable ribbons 225 towards the bottom electrode, thus deflecting the deflectable ribbon 225. A fixed ribbon 226 is at the same potential as the common bottom electrode and stays relatively taut and un-deformed during this time. Removing the bias voltage causes the deflectable ribbon 225 to spring back to its original un-deformed shape. The amount by which a ribbon 225 is deflected towards the bottom electrode depends on the applied bias voltage.

Figure 6B:
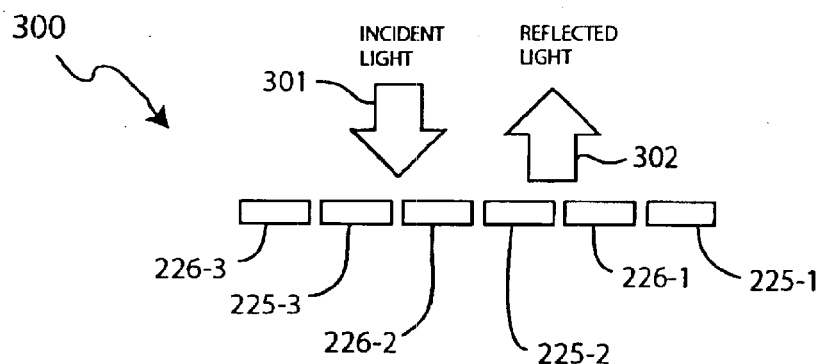
FIG. 6B schematically shows a ribbon light modulator in a specular state.

FIG. 6B schematically shows light modulator 300 in a specular state, which is a state where no bias voltage is applied on ribbons 225. In the specular state, deflectable ribbons 225 and fixed ribbons 226 are un-deflected, thereby causing an incident light 301 to reflect off the surface of the ribbons as a reflected light 302. Reflected light 302 may comprise the zero order component of incident light 301.

Figure 6C:
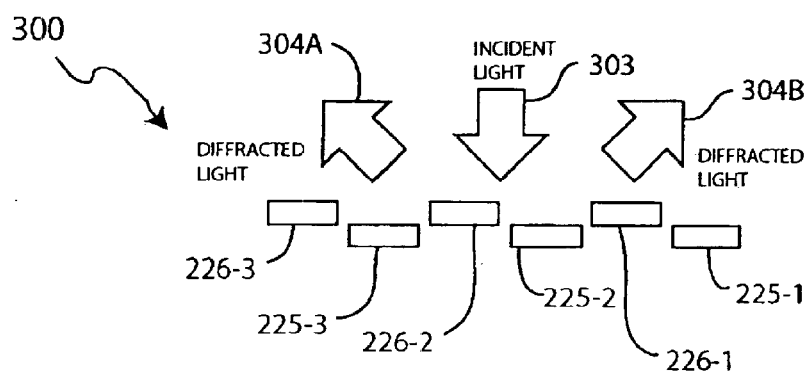
FIG. 6C schematically shows a ribbon light modulator in a diffraction state.

FIG. 6C schematically shows light modulator 300 in a diffraction state, which is a state where a bias voltage is applied to ribbons pairs 225. In the diffraction state, deflectable ribbons 225 are deflected while fixed ribbons 226 remain relatively un-deflected. As shown in FIG. 6C, this causes portions of an incident light 303 to diffract off the surface of the ribbons as diffracted light 304 (i.e., 304A, 304B). Diffracted light 304A and 304B may comprise the negative first order and first order components of incident light 303. Thus, by controlling the bias voltage to ribbons 225, the amount of light being diffracted or reflected may be controlled. The bias voltage to ribbons 225 may be generated by drive electronics (not shown) based on an image or pattern to be transferred onto the target substrate, which may be a semiconductor wafer.

Figure 7:
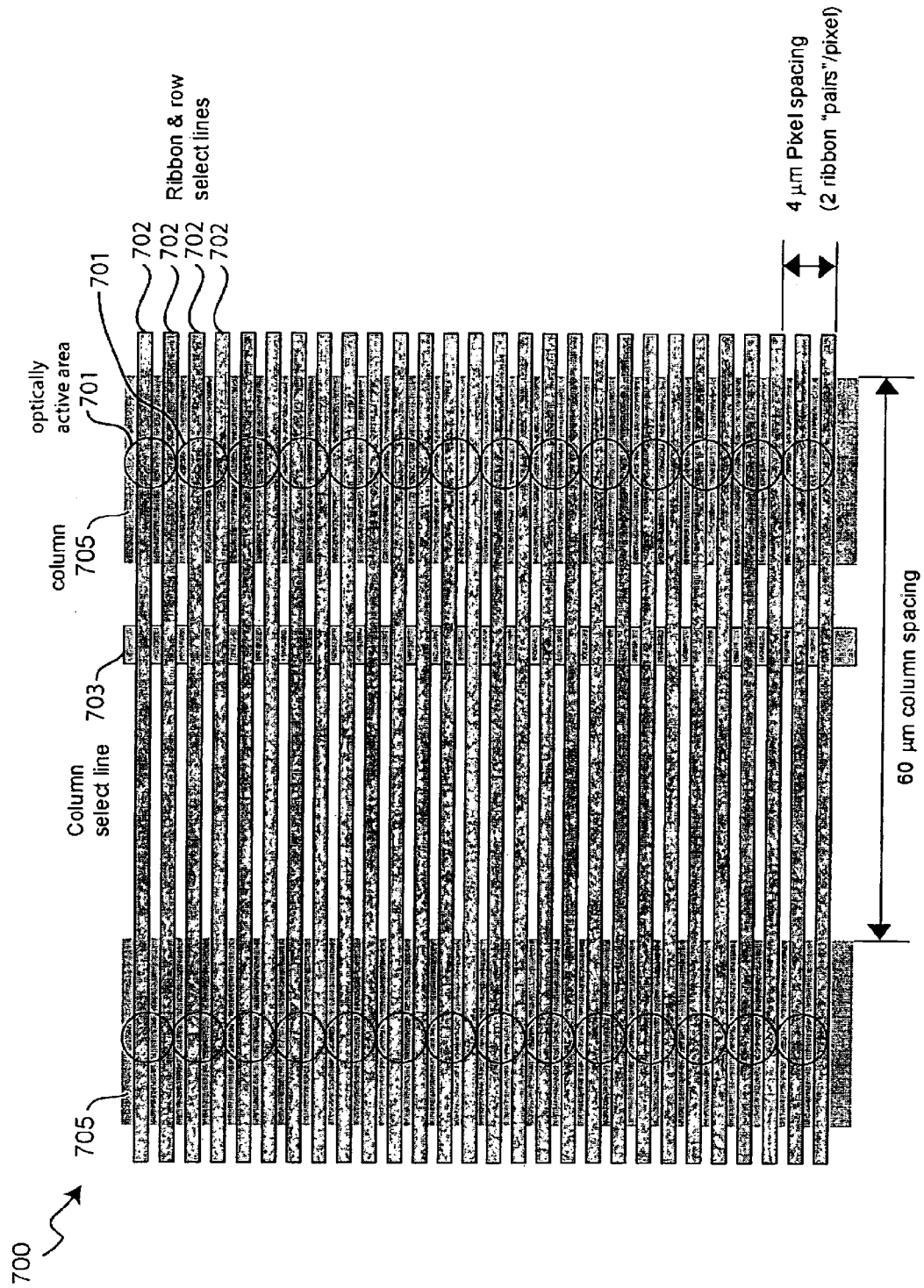
FIGS. 7–9 show schematic diagrams of light modulator arrays employing ribbon light modulators in a loosely-packed configuration, in accordance with embodiments of the present invention.

FIG. 7 shows a schematic diagram of a two-dimensional light modulator array 700 in accordance with an embodiment of the present invention. Light modulator array 700 is similar to light modulator array 105A (see FIG. 5A) in that its diffractive light modulators are loosely-packed between columns, but tightly packed between rows. In the example of FIG. 7, light modulator array 700 employs ribbon light modulators 300, with each light modulator 300 having two ribbons for each pixel of an image. Optically active area 701 represents the reflective surface of a light modulator 300 employed to diffract or reflect light. A column 705 represents a column of light modulators 300. Ribbon & row select lines 702 and column select lines 703 may be controlled to select a particular modulator. Only a few of optically active areas 701 and lines 702 have been labeled to avoid cluttering the figure.

As shown in FIG. 7, the modulators within the columns can be spaced to minimum spacing levels, as in conventional one-dimensional array approaches. Note that while optically active areas 701 are shown in FIG. 7 as discrete circles for illustrative purposes, each column of modulators may actually be illuminated by a continuous line or region of light. The spacing between the columns, however, can be much greater than minimum spacing levels. For example, the column pitch can be much greater than the minimum modulator pitch (i.e., as defined by modulator dimensions). In the example of FIG. 7, the spacing between columns is about 60 $\mu$m. The spacing between columns may also be about 15 times the modulator pitch within the columns. In this fashion, an arrangement is formed that is "loosely-packed" in one dimension, but tightly-packed in another dimension. In the example of FIG. 7, the pixel size, which relates to the optically active area of the modulator, may be about 4 $\mu$m×4 $\mu$m. The size of an individual modulator is determined by many factors, including the wavelength and numerical aperture of the illuminating light and the design of the modulators (e.g., ribbons, in one embodiment). Typical modulator sizes can fall between about 1 $\mu$m and about 100 $\mu$m. Column select lines 703 may be placed between the columns. Other optically inactive and/or control circuitry could also be located in the region between the optically active columns of modulators. Modulator array 700 may be used in a lithography system, such as that shown in FIG. 4. In that configuration, an associated microlens array can be a cylindrical or elliptical type of lens to cover each of the column optically active areas.

Figure 8:
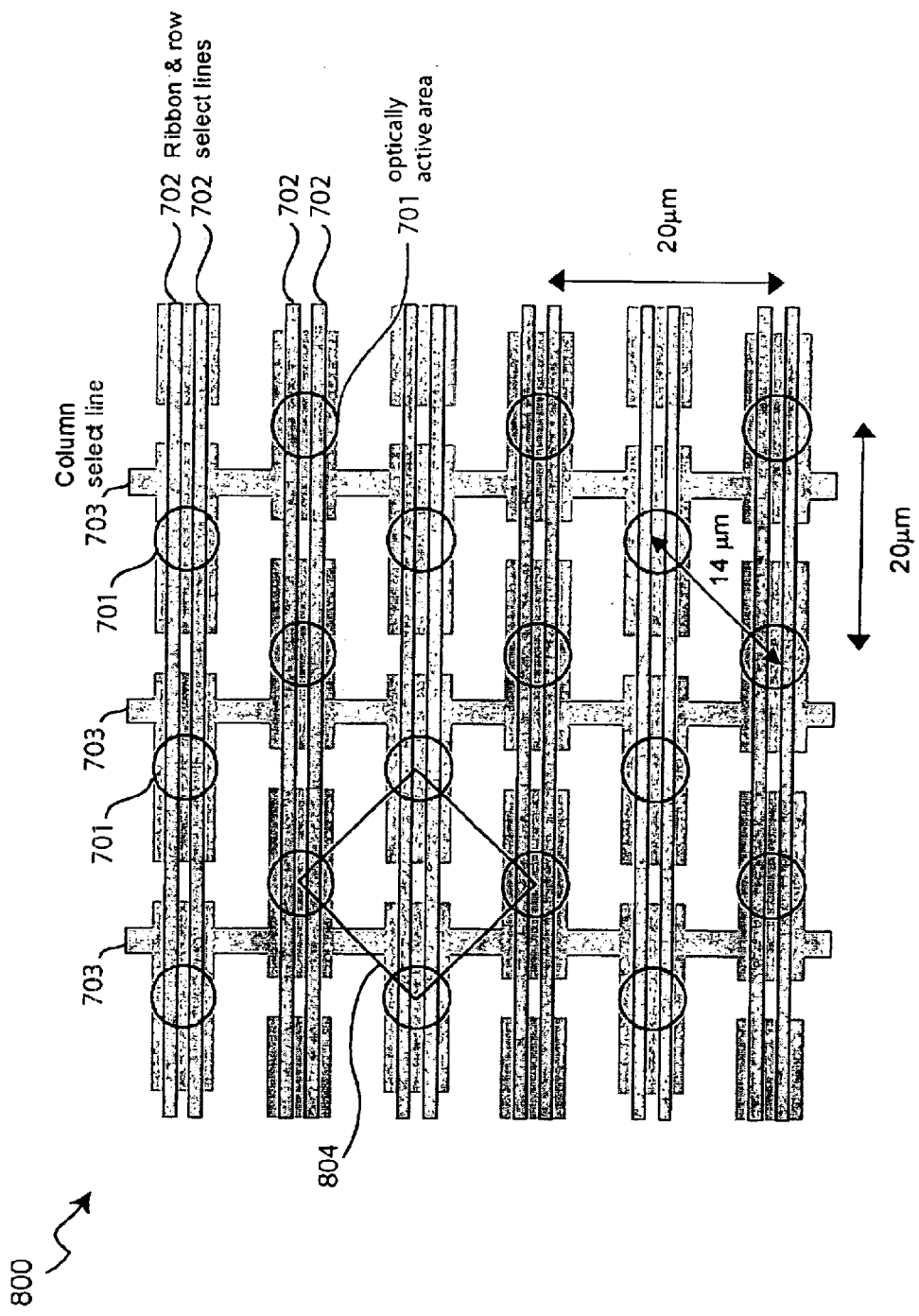

FIG. 8 shows a schematic diagram of a two-dimensional light modulator array 800 in accordance with an embodiment of the present invention. Light modulator array 800 is similar to light modulator array 105B (see FIG. 5B) in that its diffractive light modulators are loosely-packed in both dimensions in a tilted square configuration. Like light modulator array 700, light modulator array 800 includes column select lines 703 and ribbon and row select lines 702 for enabling a particular modulator. In the example of FIG. 8, the light modulators may be ribbon light modulators, with each light modulator having two ribbons per pixel.

In the example of FIG. 8, the spacing in a horizontal direction can be greater than about zero, or the minimum allowable modulator spacing. Also, the spacing in a vertical direction can be greater than about zero, or the minimum allowable modulator spacing. In the example of FIG. 8, optically active area 701 may be about a 5 $\mu$m in diameter circle. Diagonal spacing between center areas of optically active areas 701 may be about 14 $\mu$m and a repeated pattern spacing may be about 20 $\mu$m. The spacing between modulators may fall between about 10 $\mu$m and about 200 $\mu$m. In the example of FIG. 8, the repeated pattern formed by optically active areas 701 of a group of modulators is substantially a diamond shape (e.g., see pattern 804). This general type of pattern is also referred to as a "tilting" modulator arrangement.

Figure 9:
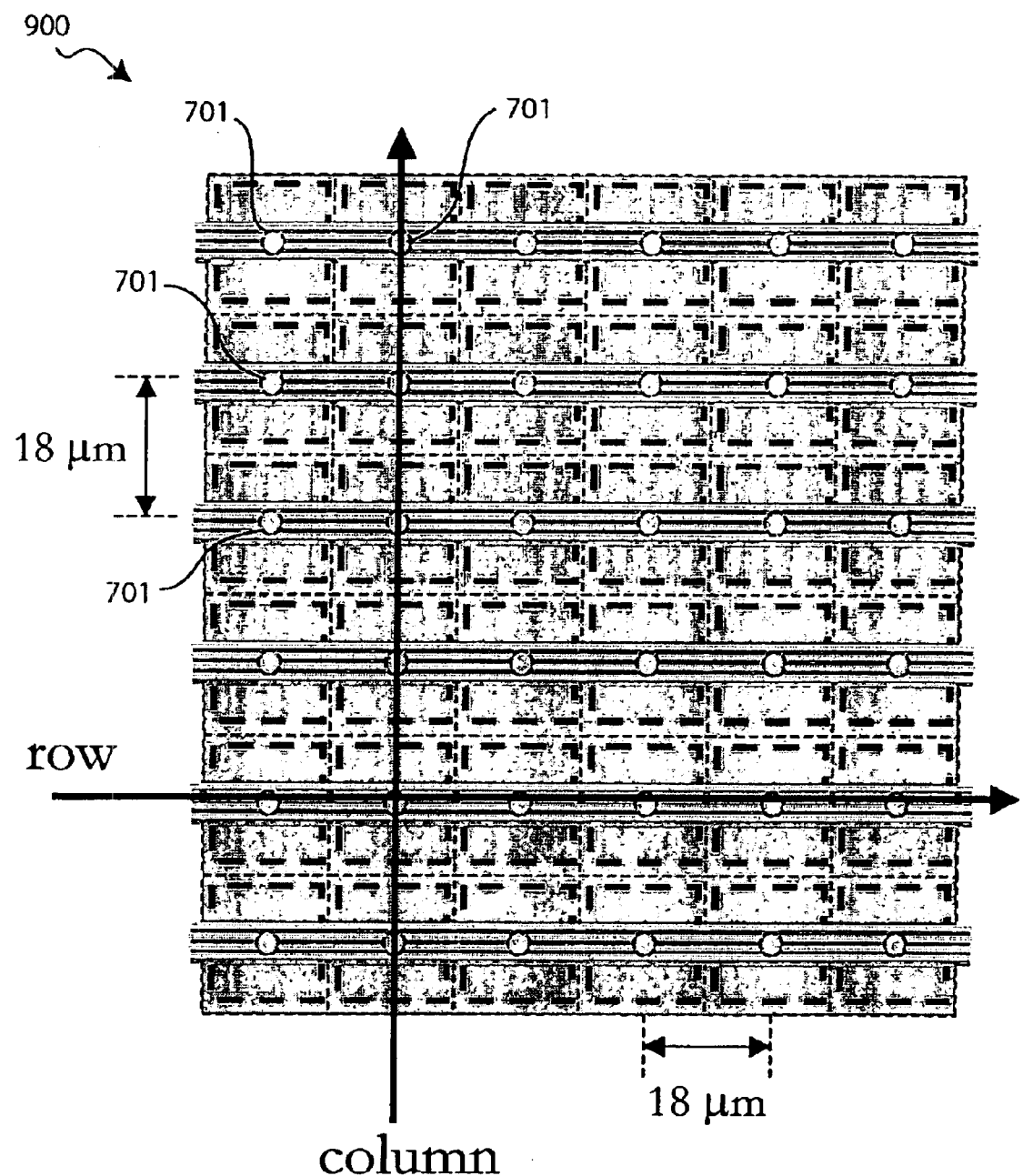

FIG. 9 shows a schematic diagram of a two-dimensional light modulator array 900 in accordance with an embodiment of the present invention. Light modulator array 900 includes ribbon light modulators that are loosely-packed in both dimensions and arranged in a square pattern. In the example of FIG. 9, the spacing or pitch between optically active areas 701 is about 18 $\mu$m along a row and along a column. Note that rectangular patterns other than square may also be used.

Figure 4:
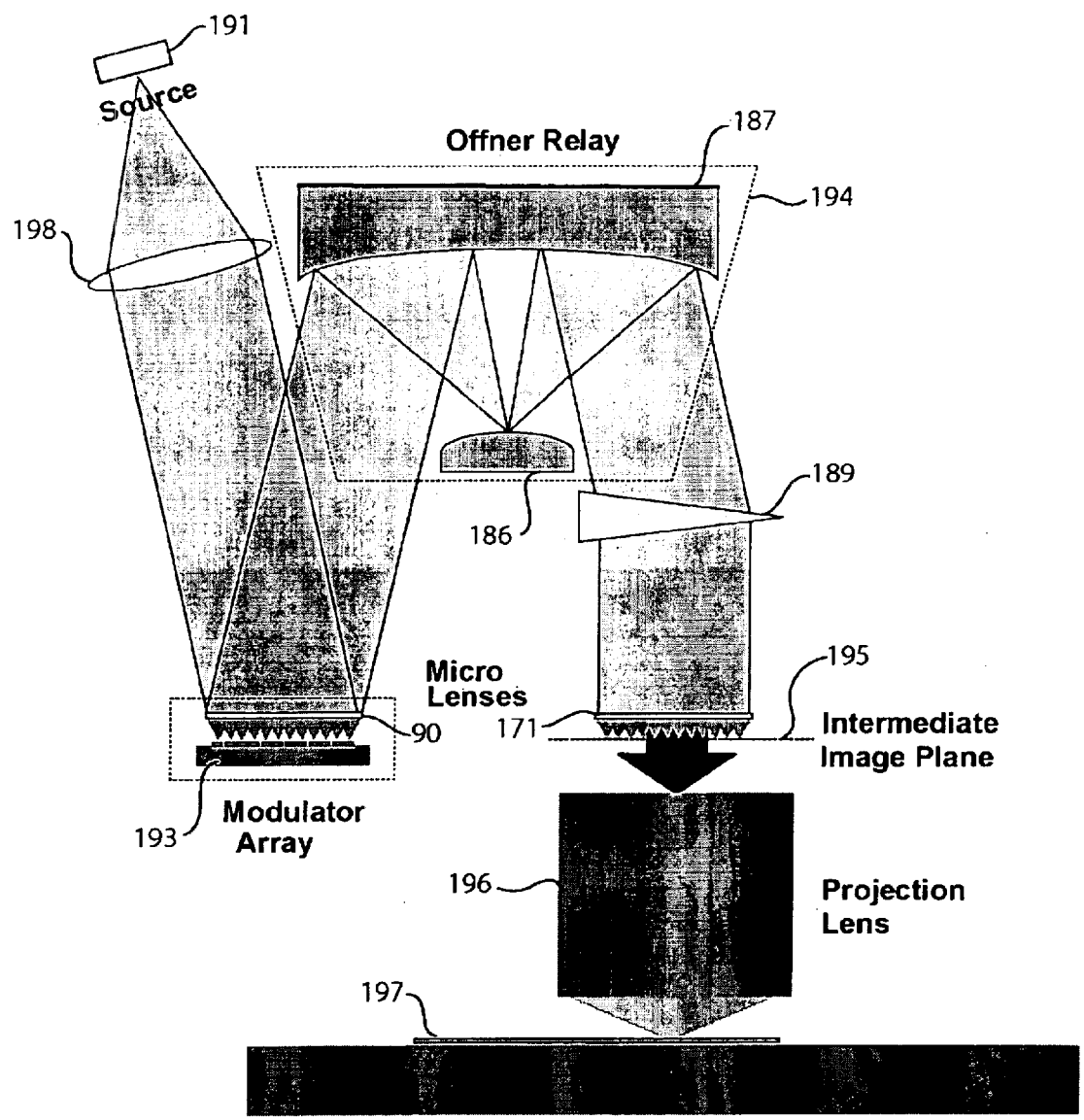

A two-dimensional light modulator array with loosely-packed diffractive light modulators in accordance with an embodiment of the present invention may be employed in a maskless lithography system, such as that shown in FIG. 4. It is to be noted, however, that embodiments of the present invention may also be employed in imaging applications other than lithography. The use of a light modulator array 800 (see FIG. 8) in the system of FIG. 4 is now described with reference to FIG. 10.

FIG. 10, which consists of FIGS. 10A, 10B, and 10C, pictorially illustrates the optical relationship between microlens array 90 (see FIG. 4) and a light modulator array 800 in the lithography system of FIG. 4, in accordance with an embodiment of the present invention. That is, in the example of FIG. 10, light modulator array 800 is employed instead of modulator array 193 in the system of FIG. 4. In the example of FIG. 10, light source 191 (see FIG. 4) may be a laser having a wavelength of about 0.2 $\mu$m, the diameter of a lenslet of the microlens array may be about 20 $\mu$m, each diffraction limited optically active area (also referred to as "spot size") may be about 5 $\mu$m, each modulator 300 may have two ribbons that are 1 $\mu$m wide each and separated by 3 gaps (one gap between the ribbons, and one on each side), the ribbons may have a pitch of about 2 $\mu$m, and the diffraction angle may be about 5.5°. Note that the aforementioned details are for illustration purposes only. For example, more than two ribbons may be designated for each pixel of a pattern.

Referring to the top view of FIG. 10A, microlens array 90 may comprise a plurality of lenslets 91 (i.e., 91-1, 91-2, ...) positioned over the loosely-packed ribbon light modulators 300 of modulator array 800. FIG. 10A pictorially illustrates an input light beam passing through lenslet 91-4 and being separated into its constituent negative first order, zero order, and positive first order components by the modulation action of the light modulator 300. Note that the components of the light beam remaining after impinging on the light modulator will depend on the modulation.

FIG. 10B, which shows a side view of FIG. 10A along column select lines 703, pictorially illustrates input light beam 95 passing through lenslet 91-4, being modulated by a light modulator 300, and bouncing out through lenslet 91-9 towards Offner relay 194 (see FIG. 4) as output light beam 96. In the example of FIG. 10B, each optically active area 701 is about 5 $\mu$m in diameter, and the lenslet pitch is about 20 $\mu$m to coincide with a repeated pattern pitch of modulator array 800 (see 20 $\mu$m spacing in the example FIG. 8). The diffraction angle from two ribbon pairs per modulator 300 may be about 5.5 degrees in the example of FIG. 10B.

FIG. 10C, which shows a side view of FIG. 10A along select lines 702, pictorially illustrates an input light beam impinging on a modulator 300 by way of lenslet 91-4. Any resulting negative first order component of the light beam may pass through lenslet 91-1, while any resulting positive first order component may pass through lenslet 91-6. Any resulting zero order component may pass through lenslet 91-9.

It is to be noted that the dimensions, angles, and lens arrangements shown in FIG. 10 provide one example, which can be expected to change for different designs. For example, the diffraction angle might be between 1 degree and as high as 60 degrees. While this example shows the first order beams exiting directly through the center of a lenslet (albeit a different lenslet from the zero order), this is not necessarily so in systems where the first order beam is not collected. Also, there may be a larger relay lens which images the microlens array onto the light modulator array. In some embodiments, the illuminating beam will be normal to the modulator surface, and the modulated beam (zero order) will trace the same exact path in reverse.

Figure 11:
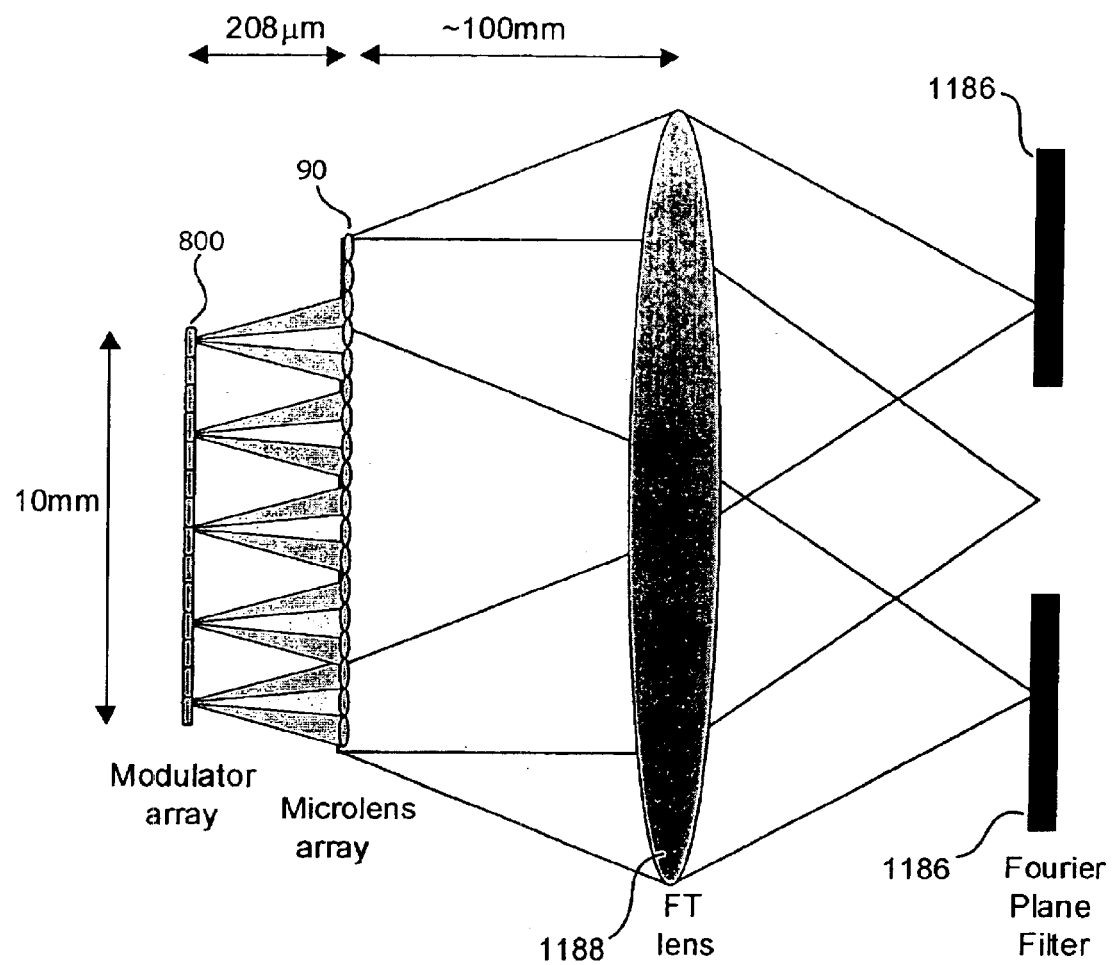
FIG. 11 shows a schematic diagram pictorially illustrating the optical relationship between a light modulator array and the components of a Fourier transform optical system, in accordance with an embodiment of the present invention.

FIG. 11 shows a schematic diagram pictorially illustrating the optical relationship between a light modulator array 800 (or other light modulator array with loosely-packed modulators) and the components of a Fourier transform optical system, in accordance with an embodiment of the present invention. The Fourier transform optical system may include a Fourier transform lens 1188, a Fourier plane filter 1186, and an inverse Fourier transform lens (not shown). In the example of FIG. 11, light modulator array 800 may be about 10 mm wide, the distance between modulator array 800 and microlens array 90 may be about 208 $\mu$m, and the distance between microlens array 90 and Fourier transform lens 1188 may be about 100 mm. Modulated light from light modulator array 800 is projected on Fourier transform lens 1188. Depending on implementation, Fourier plane filter 1186 may be configured to pass only the zero order or the negative first order/positive first order components passing through Fourier transform lens 1188. Components passing through Fourier plane filter 1186 reach the inverse Fourier transform lens (not shown) located forward of the Fourier plane filter 1186. From the inverse Fourier transform lens, the components are projected onto the target surface.

Modulator array 800 and microlens array 90 may be optically aligned relatively to each other and held rigidly. One way to accomplish this, which is very consistent with the small (e.g., 208 micron) spacing between the two, is to put these two elements in the same package. That is, modulator array 800 and microlens array 90 may be integrated in a single package. In particular, microlens array 900 may be used in place of the optical window present in many existing optical device packages, thereby accomplishing the lensing function and package sealing at the same time.

FIG. 12, which consists of FIGS. 12A, 12B, and 12C, pictorially illustrates the scanning relationships between loosely-packed modulators in a two-dimensional modulator array in accordance with an embodiment of the present invention. In FIG. 12A, point 1200 indicates the location of a pixel from a first light modulator relative to a substrate (e.g., semiconductor wafer) at time t=0. Point 1210 indicates the location of a pixel from the same light modulator at a time t=10 (or for the $10^{th}$ laser pulse) in a scanning direction 1231. In the example of FIG. 12, the pixels are scanned across a stationary substrate. However, depending on the application, the substrate may also be scanned relative to the pixels. In FIG. 12B, point 1206 indicates the location of a pixel from a second light modulator in the same modulator array at time t=0. Because of the loosely-packed configuration of the modulators along the scanning direction, adjacent pixels do not occur on the substrate at the same time. FIG. 12C shows the pixels from the first and second light modulators relative to lenslets 91 of a microlens array 90 (see FIG. 4) over the light modulator array.

Figure 13:
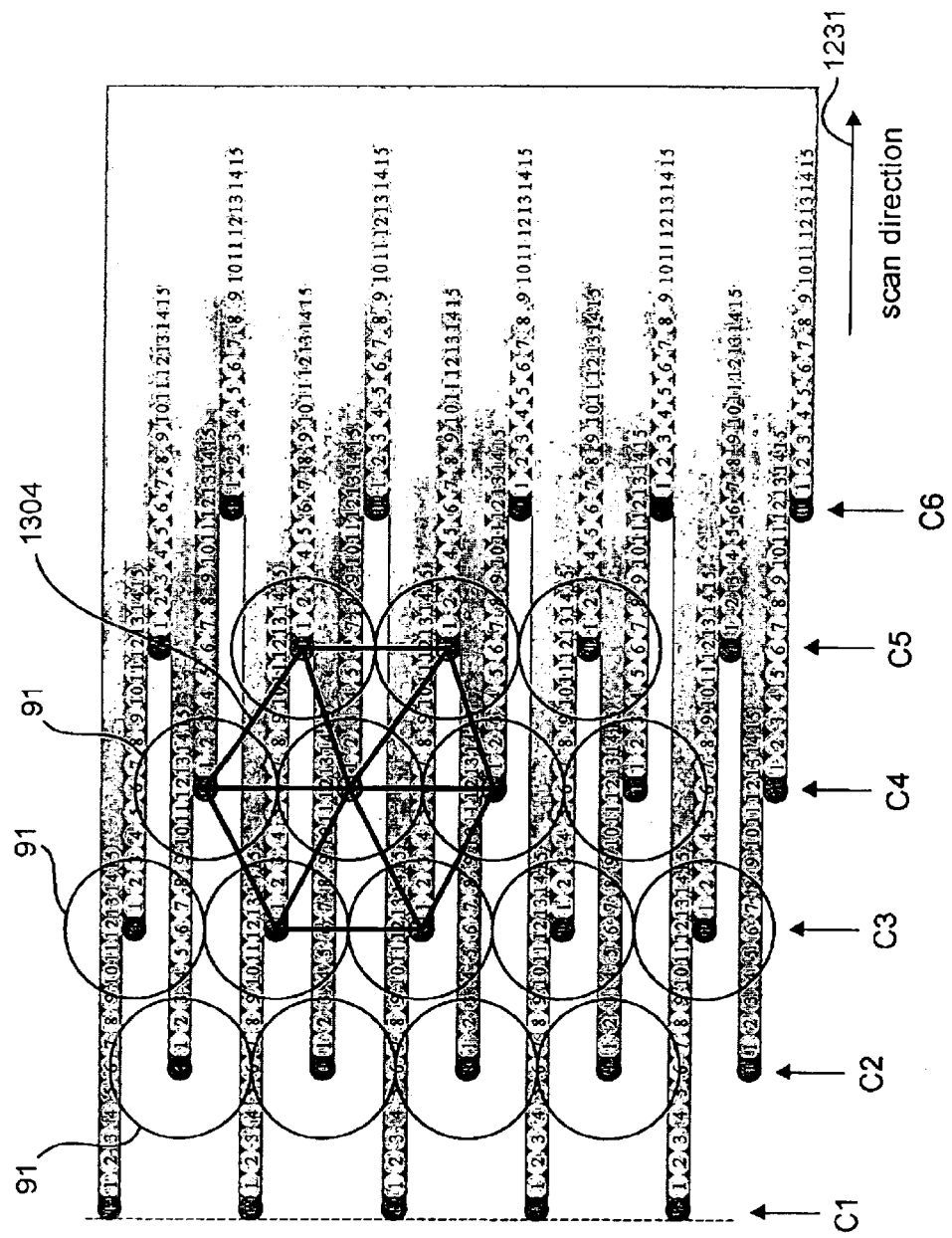
FIG. 13 pictorially illustrates the scanning relationships between loosely-packed modulators in a two-dimensional modulator array in accordance with an embodiment of the present invention.

FIG. 13 pictorially illustrates the scanning relationships between loosely-packed modulators in a two-dimensional modulator array in accordance with an embodiment of the present invention. In the example of FIG. 13, the modulators are loosely-packed in a hexagonal pattern (see pattern 1304) to print 30 rows of pixels on a substrate. FIG. 13 also shows the relationship between lenslets 91 of a microlens array 90 and the pixels. In FIG. 13, "C1" indicates pixels from a first column of light modulators, "C2" indicates pixels from a second column of light modulators, and so on. As in FIG. 12, the pixels are scanned across the substrate in the scanning direction 1231. As can be appreciated from FIG. 13, although the modulators are loosely packed and adjacent pixels are not printed at the same time, the pixels will eventually fill up an entire plane of a pattern as the pixels are scanned across the substrate. A bitmap that takes into account the scanning direction and the position of each pixel for any given time may therefore be created to print an entire pattern on the substrate.

The loosely-packed modulator arrangement disclosed herein may also be used to support different scanning direction methods relative to the light modulator array die. If, for example, the modulator rows are oriented at a slight angle relative to the axes of the modulator die (e.g., as may be the case for FIG. 13), then a scan effectively parallel to an axis of the die can print a complete swath. This might be easier to implement than a configuration where the modulators on the die are formed in rows parallel to the die axis, and the scan direction is tilted relative to the die axis. If the lithographic target is a die on a semiconductor wafer, the scan direction can be oriented substantially with the orientation of the die. That is, if the die is oriented along an x-direction, for example, the scan direction may also be substantially in the x-direction. Alternatively, the scan direction may be in some other direction relative to the x-direction, such as a direction at an angle offset from the x-direction.

While specific embodiments of the present invention have been provided, it is to be understood that these embodiments are for illustration purposes and not limiting. Many additional embodiments will be apparent to persons of ordinary skill in the art reading this disclosure.

What is claimed is:

1. An imaging apparatus comprising:
    a first of diffractive light modulators along a column of a light modulator array; and
    a second set of diffractive light modulators along a row of the light modulator array, the diffractive light modulators in the second set being arranged such that optically active areas along the row are spaced apart, wherein the diffractive light modulators in the second set have a pitch that is at least twice the size of an optically active area of a diffractive light modulator in the light modulator array.

2. The apparatus of claim 1 wherein the diffractive light modulators in the first set and the second set comprise ribbon light modulators.

3. The apparatus of claim 1 further comprising:
    a light source configured to shine a light beam onto the light modulator array, the light modulator array being configured to modulate the light beam on to a substrate.

4. The apparatus of claim 3 further comprising a projection lens over the substrate.

5. The apparatus of claim 1 further comprising a microlens array and wherein the light modulator array and the microlens array are in a same integrated packaging.

6. The apparatus of claim 1 wherein a spacing between diffractive light modulators in the first set is different from a spacing between diffractive light modulators in the second set.

7. The apparatus of claim 1 wherein a spacing between diffractive light modulators in the first set is substantially the same as a spacing between diffractive light modulators in the second set.

8. The apparatus of claim 1 wherein optically active areas in the light modulator array have a repeating pattern.

9. The apparatus of claim 8 wherein the repeating pattern comprises a rectangular pattern.

10. A lithography system comprising:
    A light modulator array comprising a plurality of diffractive light modulators arranged in columns, the diffractive light modulators within the columns having a first pitch and the columns being spaced according to a second pitch; and
    A lens configured to project modulated light from the light modulator onto a substrate being patterned, wherein the first pitch is at least two times the size of an optically active area of a diffractive light modulator in the light modulator array.

11. The lithography system of claim 10 wherein the first pitch is greater than the second pitch.

12. The lithography system of claim 10 wherein the first pitch is substantially the same as the second pitch.

13. The lithography system of claim 10 further comprising a microlens array in a same packaging as the light modulator array.

* * * * *

UNITED STATES PATENT AND TRADEMARK OFFICE
CERTIFICATE OF CORRECTION

PATENT NO. : 6,947,199 B2
DATED : September 20, 2005
INVENTOR(S) : Roxlo et al.

It is certified that error appears in the above-identified patent and that said Letters Patent is hereby corrected as shown below:

Column 10,
Line 5, after "a first" insert -- set --.

Signed and Sealed this

Fifteenth Day of November, 2005

JON W. DUDAS
*Director of the United States Patent and Trademark Office*